(12) United States Patent
Yamada et al.

(10) Patent No.: US 7,414,474 B2
(45) Date of Patent: Aug. 19, 2008

(54) OPERATIONAL AMPLIFIER

(75) Inventors: Yasuo Yamada, Hamamatsu (JP); Kenji Yokoyama, Tokyo (JP)

(73) Assignee: Flying Mole Corporation (JP)

( * ) Notice: Subject to any disclaimer, the term of this patent is extended or adjusted under 35 U.S.C. 154(b) by 19 days.

(21) Appl. No.: 11/513,055

(22) Filed: Aug. 31, 2006

(65) Prior Publication Data

US 2007/0069815 A1    Mar. 29, 2007

(30) Foreign Application Priority Data

Sep. 7, 2005    (JP) .............................. 2005-259760

(51) Int. Cl.
  *H03F 3/45* (2006.01)
(52) U.S. Cl. ...................... 330/255; 330/261
(58) Field of Classification Search ................ 330/255, 330/257, 261, 267, 268
  See application file for complete search history.

(56) References Cited

U.S. PATENT DOCUMENTS

| | | |
|---|---|---|
| 5,327,100 A | 7/1994 | Stockstad et al. |
| 5,475,339 A | 12/1995 | Maida |
| 5,642,078 A | 6/1997 | Navabi et al. |
| 6,268,769 B1 * | 7/2001 | Yamauchi et al. ........... 330/255 |

OTHER PUBLICATIONS

"Semiconductor Introductory Course 2, Semiconductor Circuit II by Program Learning", pp. 179-181, written and edited by the Vocational Training Development Textbook Committee (Kosaido Publishing 1990).

* cited by examiner

*Primary Examiner*—Khanh V Nguyen
(74) *Attorney, Agent, or Firm*—Bacon & Thomas, PLLC

(57) ABSTRACT

An operational amplifier with a broad applicable band and little disturbing noise which is capable of preventing oscillation even when used in connection with a negative feedback path. The operational amplifier amplifies a difference between two input voltage signals to a non-inverting input terminal and an inverting input terminal and outputs the amplified difference to an output terminal. The operational amplifier includes an input voltage/current conversion stage which outputs, to the non-inverting input terminal and the inverting input terminal, a current signal having a difference current component in accordance with the difference between the two input voltage signals; a current amplification stage which performs current amplification on the current signal outputted from the input voltage/current conversion stage; and an output buffer stage which converts, into a voltage signal, the output current signal from the current amplification stage and applies the voltage signal to the output terminal.

3 Claims, 3 Drawing Sheets

OPERATIONAL AMPLIFIER

CROSS-REFERENCE TO RELATED APPLICATION

This application claims, under 35 USC 119, priority of Japanese Application No. 2005-259760 filed Sep. 7, 2005.

BACKGROUND OF THE INVENTION

1. Field of the Invention

The invention relates to an operational amplifier, and is applicable to, for example, an operational amplifier applicable to a preamplifier, a premain amp, and the like in an audio system.

2. Description of the Background Art

A conventional IC-compatible operational amplifier is mentioned in Reference 1 ("Semiconductor Introductory Course 2 Semiconductor circuit II by program learning", written and edited by Vocational Training Development Textbook Committee, and published by KOSAIDO PUBLISHING, PP. 179-181.) The configuration of the operational amplifier mentioned in Reference 1 is basic configuration that is adopted in 072-series operational amplifiers sold by various companies.

The operational amplifier mentioned in Reference 1 has: as shown in FIG. 4, a differential amplifier that converts into a current signal a difference voltage (input voltage) between an input potential to a non-inverting input terminal (+ input terminal) and an input potential to an inverting input terminal (− input terminal); an emitter follower that converts, into a voltage signal, the current signal obtained by the conversion; a grounded-emitter amplifier that amplifies the output voltage from the emitter follower; and a power amplifier that outputs, to an output terminal, the output voltage signal from the grounded-emitter amplifier.

However, the conventional operational amplifier suffers from the following problems.

First, the conventional operational amplifier has a large number of transistors suffering from a problem with the parasitic capacity between a base and a collector (Miller effect), thus resulting in a narrow band applicable to the operational amplifier.

Secondly, due to the presence of a large number of transistors suffering from the Miller effect problem, the maximum phase rotation of an output signal with respect to an input in the operational amplifier exceeds 180 degrees, thus causing a risk of oscillation in application of this operational amplifier with an additional negative feedback path.

Thirdly, due to the presence of a large number of transistors suffering from the Miller effect problem, large disturbing noise is generated.

SUMMARY OF THE INVENTION

In view of the problem as mentioned above, the present invention has been made, and it is an object of the present invention to provide an operational amplifier with a broad applicable band and little disturbing noise which is capable of preventing oscillation even when used in connection with a negative feedback path.

To achieve the object mentioned above, according to one aspect of the present invention, an operational amplifier, which amplifies a difference between two input voltage signals to the non-inverting input terminal and the inverting input terminal and then outputs the amplified difference to the output terminal, includes: an input voltage/current conversion stage which outputs to the non-inverting input terminal and the inverting input terminal a current signal including a difference current component in accordance with the difference between the two input voltage signals; a current amplification stage which outputs a current signal obtained by performing current amplification only on a difference current component in the current signal outputted from the input voltage/current conversion stage; and an output buffer stage which converts, into a voltage signal, the output current signal from the current amplification stage and applies the voltage signal to the output terminal.

According to the present invention, the current amplification stage is provided so that information on the difference voltage of the two input voltage signals is transmitted by the current signal to the output buffer stage, thus permitting minimizing the number of transistors suffering from a Miller effect problem in a path from an input and an output, which in turn permits providing an operational amplifier with a broad applicable band and little disturbing noise which is capable of preventing oscillation even when used in connection with a negative feedback path.

DETAILED DESCRIPTION OF THE PREFERRED EMBODIMENTS

(A) Embodiment

Hereinafter, an operational amplifier according to one embodiment of the present invention will be mentioned.

(A-1) Configuration of the Embodiment

Figure 1:
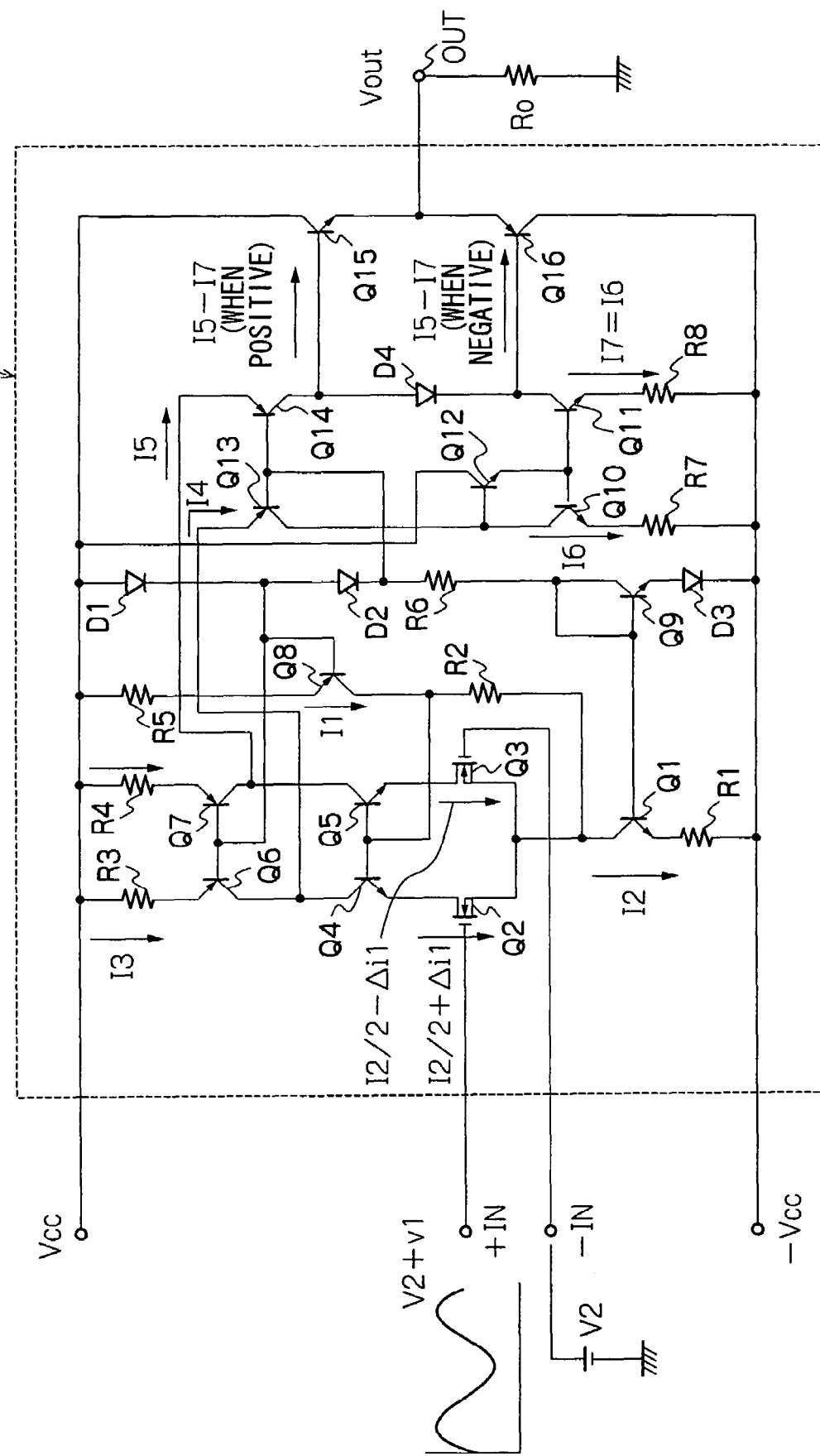
FIG. 1 is a circuit diagram showing the overall configuration of an operational amplifier according to one embodiment of the present invention.

FIG. 1 is a circuit diagram showing the overall configuration of the operational amplifier of the present embodiment. In FIG. 1, an operational amplifier 1 of the present embodiment has: transistors Q1 to Q16, resistors R1 to R8, and diode parts D1 to D4, which are designed to be IC (semiconductor integrated circuit) -compatible. The notation of the diode parts D1 to D4 in FIG. 1 denotes one diode or a series circuit of a plurality of diodes.

The operational amplifier 1 has a positive power supply terminal (+ power supply terminal) Vcc and a negative power supply terminal (− power supply terminal) −Vcc. Hereinafter, the description is based on the assumption that a positive and a negative dc power supply voltages having different signs but the same absolute values are applied to the positive power supply terminal Vcc and the negative power supply terminal −Vcc, respectively. However, the negative power supply terminal −Vcc may have a different potential, such as a ground potential or the like.

Moreover, the operational amplifier 1 has a non-inverting input terminal +IN and an inverting input terminal −IN, and also an output terminal OUT. A complementary signal may be inputted to the non-inverting input terminal +IN and the inverting input terminal −IN, or a pair of signals complementary to each other may be inputted.

In a case where this operational amplifier 1 is used in, for example, a preamplifier in an audio system, the operational amplifier 1 is used in such a manner that an audio signal V2+v1 having a certain bias potential V2 is inputted to the non-inverting input terminal +IN while a bias potential V2 is inputted to the inverting input terminal −IN, that the bias potential V2 is removed, and that an amplified audio signal Vout is supplied from the output terminal OUT to a load resistor R0.

The operational amplifier 1 of the embodiment is roughly composed of: an input voltage/current conversion stage, a current amplification stage, an output buffer stage (power amplification stage), and a constant potential formation part. The constant potential formation part is part of each of the input voltage/current conversion stage and the current amplification stage.

The constant potential formation part corresponds to the portion including the diode part D1, the diode part D2, a resistor R6, an N-type transistor Q9 (serially interpolated between the collector and the emitter), and the diode part D3, which are serially connected together between a positive supply line and a negative supply line. The constant potential at each connection point between the elements is used for various parts.

The input voltage/current conversion stage forms a differential amplifier circuit mainly composed of a pair of FET transistors Q2 and Q3. The gates of the pair of FET transistors Q2 and Q3 are connected to the non-inverting input terminal +IN and the inverting input terminal −IN, respectively. The transistors Q2 and Q3 are central to amplification operation, and thus, unlike the transistors at the other sections, FET transistors with a high gain are applied.

The common source of these FET transistors Q2 and Q3 is connected to the negative supply line via a collector-emitter of the N-type transistor Q1 and the resistor R1. The base of the N-type transistor Q1 is connected to the base and collector of the N-type transistor Q9 mentioned above so that a constant potential can be applied. The N-type transistor Q1 and the resistor R1 form a constant current source.

Between the positive supply line and the drain of the FET transistor Q2, the resistor R3, an emitter-collector of the P-type transistor Q6, and a collector-emitter of the N-type transistor Q4 are serially connected. Between the negative supply line and the drain of the FET transistor Q3, the resistor R4, an emitter-collector of the P-type transistor Q7, and a collector-emitter of the N-type transistor Q5 are serially connected. The bases of the two P-type transistors Q6 and Q7 are connected together, and their common base is connected to a connection point between the diode parts D1 and D2 mentioned above so that the constant potential can be applied. The resistor R3 and the P-type transistor Q6 form a constant current source while the resistor R4 (having the same resistance value as that of the resistor R3) and the P-type transistor Q7 also form a constant current source, both of which have the same constant currents.

Between the positive supply line and the common source of the two FET transistors Q2 and Q3, the resistor R5, the emitter-collector of a P-type transistor Q8, and the resistor R2 are serially connected. The base of the P-type transistor Q8 is connected to the connection point between the diode parts D1 and D2 mentioned above so that a constant potential can be applied. The resistor R5 and the P-type transistor Q8 form a constant current source. The two bases of the N-type transistors Q4 and Q5 are connected together, and their common base is connected to the common source of the FET transistors Q2 and Q3c via the resistor R2. The resistor R5, the P-type transistor Q8, the resistor R2, and the N-type transistors Q4 and Q5 form a bootstrap circuit that keeps constant the potential between the drain and the source of the FET transistors Q2 and Q3.

The current amplification stage synthesizes, from a pair of complementary output current signals supplied from the input voltage/current conversion stage, fluctuations with different signs included in the respective output current signals by equalizing the signs thereof (doubling the fluctuation).

The output buffer stage transforms an output current from the current amplification stage into a voltage and outputs it to the output terminal OUT, using a push-pull configuration in the present embodiment.

The current amplification stage has the transistor Q10 to Q14, the resistors R7 and R8, and the diode part D4. The output buffer stage has the transistors Q15 and Q16.

Between the collector of the P-type transistor Q7 in the input voltage/current conversion stage and the negative supply line, an emitter-collector of the P-type transistor Q13, a collector-emitter of the N-type transistor Q10, and the resistor R7 are serially connected. Between the collector of the P-type transistor Q6 in the input voltage/current conversion stage and the negative supply line, an emitter-collector of the P-type transistor Q14, the diode part D4, a collector-emitter of the N-type transistor Q11, and the resistor R8 (having the same resistance value as that of the resistor R7) are serially connected. The gates of the two P-type transistors Q13 and Q14 are connected to each other, and their common gate is connected to the connection point between the diode part D2 and the resistor R6 mentioned above. The bases of the two N-type transistors Q10 and Q11 are connected to each other, and their common base is connected to the emitter of the N-type transistor Q12. The base of the N-type transistor Q12 is connected to the collector of the N-type transistor Q10, and the collector of the N-type transistor Q12 is connected to the positive supply line. The portion including the transistors Q10 to Q12, the resistors R7 and R8 form a current mirror circuit.

Between the positive supply line and the negative supply line, a collector-emitter of the N-type transistor Q15 and an emitter-collector of the P-type transistor Q16 are serially connected. The base of the N-type transistor Q15 is connected to the collector of the P-type transistor Q14 while the base of the P-type transistor Q16 is connected to the collector of the N-type transistor Q11. The connection point between the emitters of the two P-type transistors Q15 and Q16 is connected to the output terminal OUT.

Although not mentioned above, the transistors in pairs (for example, the FET transistors Q2 and Q3), the two transistors complementary to each other (for example, the P-type transistor Q15 and the N-type transistor Q16), and the like have various properties.

(A-2) Operation of the Embodiment

Next, the operation of the operational amplifier of an embodiment having the circuit configuration mentioned above will be mentioned.

Signals inputted from the non-inverting input terminal +IN and the inverting input terminal −IN are respectively inputted into the gates of the FET transistors Q2 and Q3 that form the differential input stage. Hereinafter, a detailed description will be given as appropriate, referring to, as an example, a case where the signal V2+v1 biased by the bias potential V2 is inputted to the non-inverting input terminal +IN while the bias potential V2 mentioned above is inputted to the inverting input terminal −IN.

The potential between the drain and source of these FET transistors Q2 and Q3 is kept at a constant potential (V1-0.6) by the bootstrap circuit composed of the constant current source (Q8, the resistor R5) and the resistor R2.

The constant current source here is composed of the P-type transistor Q8 and the resistor R5, serving as a current source of a current I1. The resistor R2 serves as a load that receives this current I1, generating a constant potential difference V1. As a result, the potential between the drain and source of the FET transistors Q2 and Q3 is the constant potential V1-0.6 obtained by subtracting a voltage Vf (≈0.6) between the base and emitter of the N-type transistors Q4 and Q5.

When a signal is inputted to the gates of the FET transistors Q2 and Q3 in the differential input stage, the collector potential of the N-type transistor Q1 fluctuates, but the potential between the drain and source of the FET transistors Q2 and Q3 does not change, as mentioned above. As a result, a source side of the FET transistors Q2 and Q3 move in conjunction with the fluctuation in the collector potential of the N-type transistor Q1, thus always keeping constant the potential between the gate and source of the FET transistors Q2 and Q3 and also the potential between the gate and drain thereof.

The N-type transistor Q1 serves, in combination with the resistor R1, as a constant current source that applies a constant current I2 to the differential input stage (the constant current applied by this constant current source itself is I1+I2). If a signal has not yet been inputted and the same DC bias voltage has been applied to the non-inverting input terminal +IN and the inverting input terminal −IN, the constant current I2 is equally divided and a drain current of I2/2 flows to each of the pair of FET transistors Q2 and Q3 in the differential input stage.

Now assume that, as mentioned above, the signal V2+v1 biased by the bias potential V2 is inputted in the non-inverting input terminal +IN while the bias potential V2 mentioned above is inputted in the inverting input terminal −IN. In other words, assume that the bias potential V2 is applied to the gate of the FET transistor Q3 while the biased signal V2+v1 is applied to the FET transistor Q2. Assuming that the amount of change in the drain current of the FET transistor Q2 by the signal component v1 is Δi1, the drain current of the FET transistor Q2 is I2/2+Δi1. A change of −Δi1, opposite in direction to that of the FET transistor Q2, occurs due to the action of the constant current source by the N-type transistor Q1 and the resistor R1; thus, the drain current of the FET transistor Q3 is I2/2−Δi1.

Assume that the P-type transistor Q6 and the resistor R3 form a constant current source, and the P-type transistor Q7 and the resistor R4 also form a constant current source, both having the constant current of I3.

Now, consider a current I4 flowing from a collector side of the P-type transistor Q6 to the P-type transistor Q13 with a grounded base. This current I4 is equal to a difference current I3-(I2/2+Δi1) between the constant current I3 flowing through the P-type transistor Q6 and the drain current I2/2+Δi1 of the FET transistor Q2. Now, consider a current I5 flowing from a collector side of the P-type transistor Q7 to the P-type transistor Q14 with a grounded base. This current I5 is equal to a difference current I3-(I2/2−Δi1) between the constant current I3 flowing through the P-type transistor Q7 and the drain current I2/2−Δi1 of the FET transistor Q3. The constant currents I2 and I3 do not have to be the same, but the constant currents I2 and I3 are assumed here to be the same for simplified description. In this condition, the current I4 is I2/2−Δi1 and the current I5 is I2/2+Δi1.

Now, focus on the current mirror circuit composed of the N-type transistors Q10 to Q12 and the resistors R7 and R8. A current I6 flowing through the N-type transistor Q10 is equal to the current I4 flowing through the P-type transistor Q13 mentioned above; thus the current I6 is I2/2−Δi1. Due to the action of the current mirror circuit, the current I6 flowing through the N-type transistor Q10 and a current I7 flowing through the N-type transistor Q11 are equal to each other; thus, the current I7 is also I2/2−Δi1.

Now, focus on a current path linking together the P-type transistor Q14 and the N-type transistor Q11. The current I5 flows through the P-type transistor Q14 and the current I7 flows through the N-type transistor Q11; thus, a difference current between them, i.e., I5−I7=(I2/2+Δi1)−(I2/2−Δi1)=2Δi1, is transmitted to the output buffer stage. This difference current 2Δi1 is a product obtained by doubling the current component Δi1 corresponding to the signal component v1 to the FET transistor Q2 in the differential input stage.

When this difference current 2Δi1 is positive, this difference current 2Δi1, serving as a base current of the N-type transistor Q15 of the emitter follower having the emitter thereof grounded via the load R0, flows to the N-type transistor Q15 and is outputted as a voltage signal from the output terminal OUT. When the difference current 2Δi1 is negative, this difference current 2Δi1, serving as a base current of the P-type transistor Q16 of the emitter follower having the emitter thereof grounded via the load R0, flows to the P-type transistor Q16 (more accurately, draws the current) and is outputted as a voltage signal from the output terminal OUT.

(A-3) Effects of the Embodiment

According to the embodiment mentioned above, a current signal in accordance with an input voltage signal from the input voltage/current conversion stage is amplified as it is and supplied to the output buffer stage, where the signal is converted into a voltage signal. Thus, only amplification at the transistor in the output buffer stage (Q15 or Q16) is influenced by a transistor Miller effect, thus permitting controlling the influence of the Miller effect only at one stage (1 pole) throughout the entire stages.

Thus, the phase rotation of an output signal with respect to an input signal of the operational amplifier of the embodiment is 90 degrees at maximum, thus, in principle, causing no oscillation even in the application of the operational amplifier of the embodiment to a circuit that uses a negative feedback path.

Figure 2:
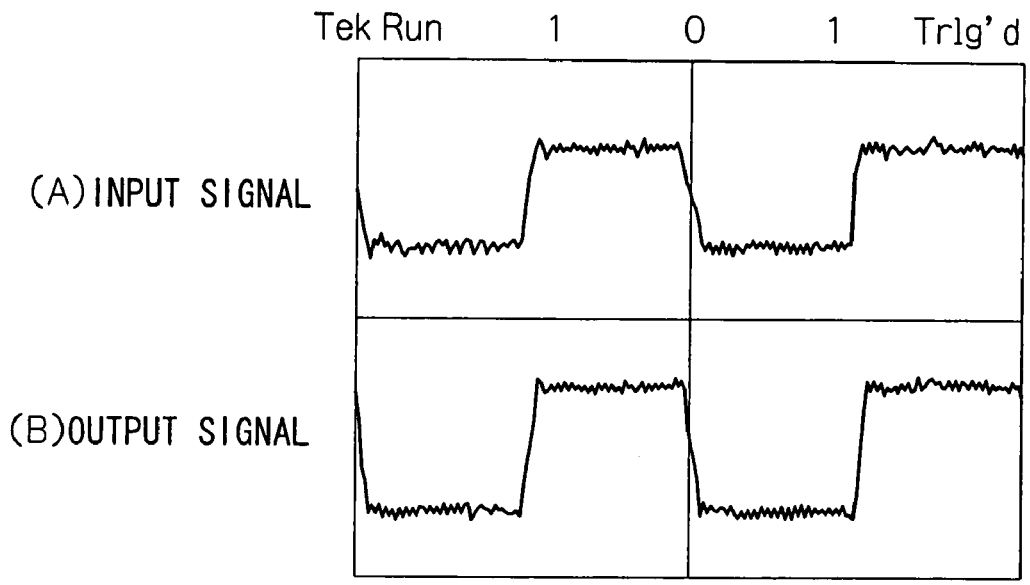
FIG. 2 is a signal waveform chart showing an input and an output signals when a rectangular wave signal of a high frequency is inputted into the operational amplifier of FIG. 1.
Figure 3:
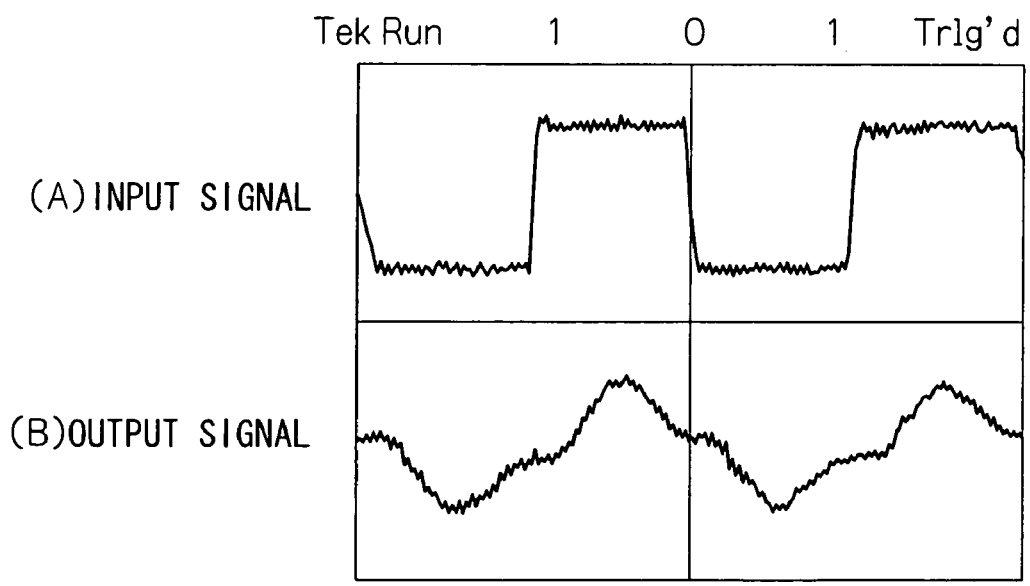
FIG. 3 is a signal waveform diagram showing an input and an output signals when a rectangular wave signal of a high frequency is inputted into a conventional operational amplifier.
Figure 4:
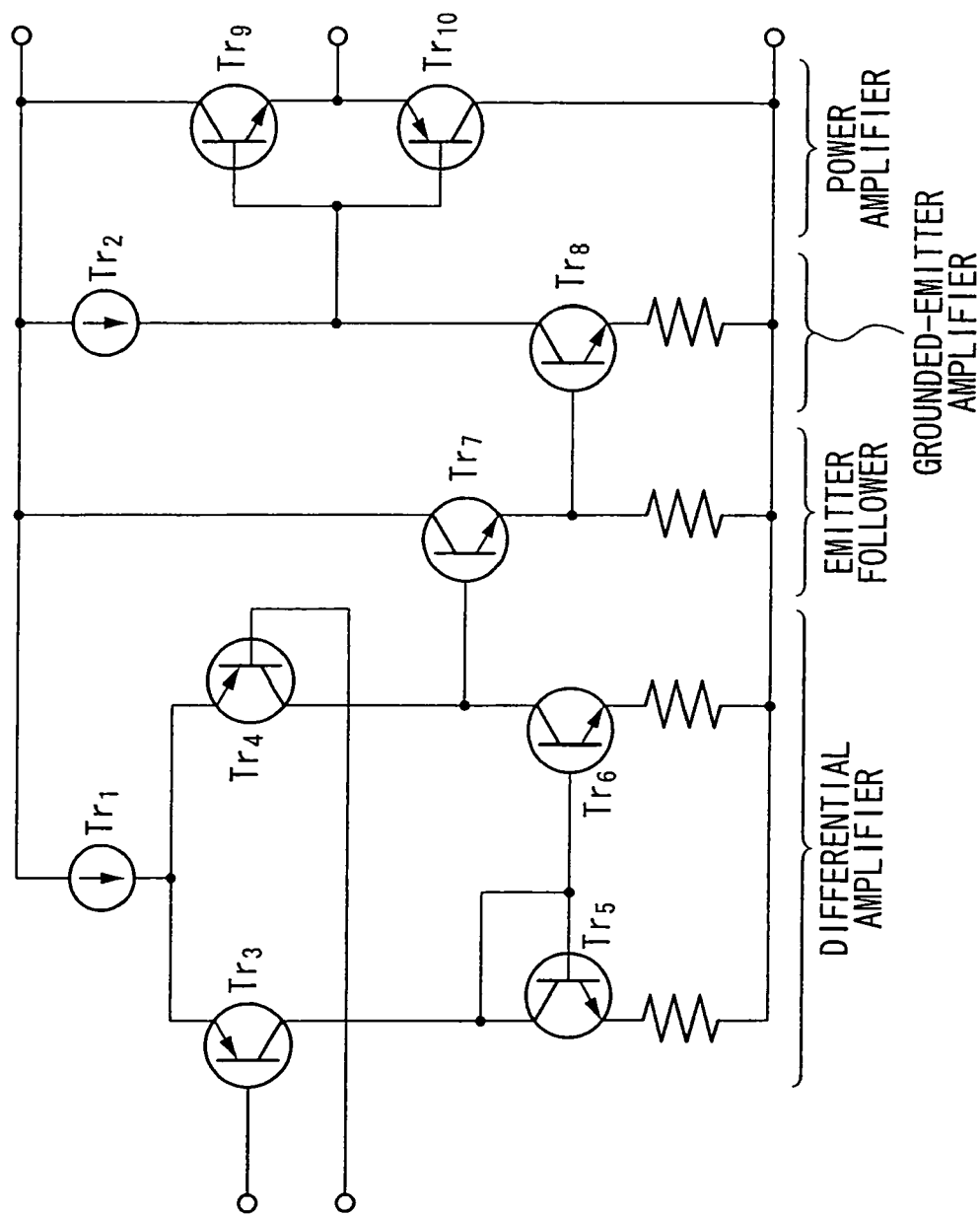
FIG. 4 is a circuit diagram showing the overall configuration of the conventional operational amplifier.

Moreover, even a signal band influenced by the Miller effect has a very small attenuation rate (approximately 6 dB/oct maximum), which poses no problem in practice. Thus, a broad band having extremely favorable high-frequency property can be adopted as an applicable band. FIGS. 2A and 2B show signal waveform diagrams of an input signal and an output signal, respectively, when a rectangular wave of 1 MHz is inputted to the operational amplifier of the present embodiment. FIGS. 3A and 3B show signal waveform diagrams of an input signal and an output signal, respectively, when the rectangular wave of 1 MHz is inputted to an 072-series operational amplifier manufactured by a certain company. Comparison made through these diagrams proves that the operational amplifier of the present embodiment has extremely favorable high-frequency property.

Further, the influence of the Miller effect can be controlled at only one stage, thus permitting achieving an operational amplifier with small disturbing noise.

(B) Another Embodiment

The technical idea of the invention is not limited to the configuration of the embodiment mentioned above; thus, a modified embodiment can be provided as illustrated below.

The embodiment mentioned above shows general basic configuration; however, additional configuration which permits an additional function may be provided to an actual product.

For example, for the two constant current sources (Q6 and R3, Q7 and R4) where the same constant current I3 flows, adjustment configuration may be provided to achieve the same constant current I3. For example, the emitters of the both transistors Q6 and Q7 may be connected together and a volume may be provided at the contact portion therebetween. In addition, for example, in order to support even an input signal having a very high frequency component, a speed-up capacitor may be connected in parallel to the resistor R2 which keeps constant the potential between the drain and source of the FET transistors Q2 and Q3. Further, for example, the bases of the two transistors Q15 and Q16 in the output buffer stage, which perform push-pull operation, may be connected together via a capacitor, so as to balance disturbing noises in a positive and a negative output signals.

As a component of the constant potential formation part, an element other than those shown in FIG. 1 may be used. For example, a zener diode may be used.

The transistor type and polarity applicable to the operational amplifier of the present invention is of course not limited to those shown in FIG. 1. A Darlington connection or the like may be adopted for one part of the transistors of FIG. 1.

The operational amplifier of the present invention is intended to be provided on one IC chip, but one part of the components may be externally provided for use, or many discrete parts may be used to compose the operational amplifier.

FIG. 1 is drawn based on an image that the DC bias voltage and the voltage in which a signal component is imposed on the DC bias voltage are inputted to the operational amplifier of the embodiment. However, the form of the pair of input signals is of course arbitrarily.

What is claimed is:

1. An operational amplifier which amplifies a difference between two input voltage signals to a non-inverting input terminal and an inverting input terminal and then outputs the amplified difference to an output terminal, the operational amplifier comprising:
   an input voltage/current conversion stage which outputs, to the non-inverting input terminal and the inverting input terminal, a current signal reflecting a difference current component in accordance with the difference between the two input voltage signals;
   a current amplification stage which outputs a current signal obtained by performing current amplification on the current signal outputted from the input voltage/current conversion stage; and
   an output buffer stage which converts, into a voltage signal, the output current signal from the current amplification stage and applies the voltage signal to the output terminal; and
   wherein the input voltage/current conversion stage outputs a complementary pair of current signals having a difference current component, and
   wherein the current amplification stage adds and synthesizes a pair of electrical signals outputted from the input voltage/current conversion stage, and outputs a current signal obtained by performing the current amplification only on the difference current component.

2. The operational amplifier according to claim 1, wherein the output buffer stage is provided with a push-pull configuration where a first transistor operating when the output current signal from the current amplification stage is positive and a second transistor operating when the output current signal from the current amplification stage is negative are connected together in series.

3. An operational amplifier which amplifies a difference between two input voltage signals to a non-inverting input terminal and an inverting input terminal and then outputs the amplified difference to an output terminal, the operational amplifier comprising:
   an input voltage/current conversion stage which outputs, to the non-inverting input terminal and the inverting input terminal, a current signal reflecting a difference current component in accordance with the difference between the two input voltage signals;
   a current amplification stage which outputs a current signal obtained by performing current amplification on the current signal outputted from the input voltage/current conversion stage; and
   an output buffer stage which converts, into a voltage signal, the output current signal from the current amplification stage and applies the voltage signal to the output terminal, and
   wherein the output buffer stage is provided with a push-pull configuration where a first transistor operating when the output current signal from the current amplification stage is positive and a second transistor operating when the output current signal from the current amplification stage is negative are connected together in series.

* * * * *